United States Patent [19]

Foster et al.

[11] Patent Number: 4,837,179
[45] Date of Patent: Jun. 6, 1989

[54] METHOD OF MAKING A LDD MOSFET

[75] Inventors: David J. Foster, Northampton; Andrew J. Pickering, Rugby, both of England

[73] Assignee: Plessey Overseas Limited, Ilford, England

[21] Appl. No.: 88,108
[22] PCT Filed: Oct. 31, 1986
[86] PCT No.: PCT/GB86/00675
§ 371 Date: Aug. 31, 1987
§ 102(e) Date: Aug. 31, 1987
[87] PCT Pub. No.: WO87/02825
PCT Pub. Date: May 7, 1987

[30] Foreign Application Priority Data
Nov. 2, 1985 [GB] United Kingdom ................ 8526062

[51] Int. Cl.$^4$ ........................................ H01L 21/265
[52] U.S. Cl. ........................................ 437/44; 437/34; 437/57; 437/160; 437/104
[58] Field of Search .................... 437/160, 29, 34, 56, 437/44

[56] References Cited
U.S. PATENT DOCUMENTS

| 4,062,699 | 12/1977 | Armstrong ........................ 437/41 |
| 4,080,618 | 3/1978 | Tango et al. . | |
| 4,209,350 | 6/1980 | Ho et al. ........................... 437/55 |
| 4,356,623 | 11/1982 | Hunter . | |
| 4,417,347 | 11/1983 | Muka et al. ........................ 437/248 |
| 4,419,810 | 12/1983 | Riseman .......................... 437/160 |
| 4,546,535 | 10/1985 | Shepard .......................... 437/160 |

FOREIGN PATENT DOCUMENTS 0010633 5/1980 European Pat. Off. .
0083785 7/1983 European Pat. Off. .
0173953 3/1986 European Pat. Off. .

OTHER PUBLICATIONS

Tsang et al., "Fabrication of High–Performance LDD Fet's with Oxide Sidewall–Spacer Technology", IEEE Trans. On Ele. Dev., vol. ED–29, No. 4, Apr. 1982, pp. 590–596.

Primary Examiner—Brian E. Hearn
Assistant Examiner—Tom Thomas
Attorney, Agent, or Firm—Fleit, Jacobson, Cohn & Price

[57] ABSTRACT

A method (FIG. 3) for producing MOS transistors of the type having shallow, lightly doped, source/drain structure. In this method sidewall fillets (7) of n-type doped dielectric material are defined adjacent to the sides of the oxide (1) and metal electrode (3) features. These fillets (7) are then employed to provide self aligned masking during implantation of heavy dopant of either n- or p- type (9; 13). In a subsequent rapid anneal step, the implant dopant is activated and n-type dopant diffused into the substrate (5) from the fillets (7) to provide lightly doped source/drain structures (11; 15).

Examples of this method are described for producing phosphorus-arsenic $n^-/n^+$ are phosphorus-boron $p^-/p^+$ source/drain structures.

6 Claims, 1 Drawing Sheet

METHOD OF MAKING A LDD MOSFET

TECHNICAL FIELD

The present invention concerns improvements in or relating to the manufacture of Metal-Oxide-Semiconductor Field-Effect (MOS) transistors, and in particular but not exclusively, NMOS/PMOS compatible methods for CMOS circuit processing.

For small ($\leq 1.5$ μm) channel length transistors, a lightly doped drain structure is highly desirable. For this range of channel lengths NMOS transistors, in particular, are susceptible to threshold—voltage and gain instabilities (hot-electron effects) due to high electric fields. Electric fields in the vicinity of the drain diffusion can be much reduced by tailoring the drain dopant profile—ie. by adopting a lightly doped drain structure.

BACKGROUND ART

In a conventional process two implant steps are used to provide the lightly doped drain structure. Usually this process comprises a heavy implant of phosphorus followed by a light implant of arsenic into silicon. Here, however, after annealing, the junction depth is deep, typically greater than 0.5 μm. It is a problem that these deep junctions degrade small channel length transistor performance, and such structures often prove to be unreliable.

DISCLOSURE OF THE INVENTION

The invention provides a method for MOS transistor manufacture, a simple and alternative method that affords shallow junction structure and thus avoids the problem just discussed.

In accordance with the invention there is thus provided a method for MOS transistor manufacture comprising essentially the following steps:

firstly, defining on a silicon crystal substrate a gate oxide and gate electrode;

secondly, applying to the gate oxide and gate electrode a deposit of dielectric material incorporating a quantity of n-type dopant, and etching same to create a narrow sidewall;

thirdly, introducing a heavy implant dose of appropriate dopant species, to produce a shallow implant adjacent to the side of the sidewall; and, fourthly, annealing to regrow the silicon crystal and to activate the implanted dopant.

The method aforesaid requires no additional implantation. An implant step has thus been obviated. Instead, doped dielectric material has been used and the transistor manufacture process simplified. The action of the light implant comes from the doped dielectric. This adds dopant to the drain (and also the source) on the channel side of the drain (source). The addition of this light diffusion tends to lower electric field at the drain-channel junction and thus leads to improvement in the electrical performance of the transistor.

The implant species may be either p+-type or n+-type and the method thus is applicable to the manufacture of either PMOS or NMOS transistors - ie. it is applicable to CMOS processing. Channels of length less than or of the order 1.5 μm can be exploited in transistors produced thus.

The invention thus improves operational reliability in small geometry transistors with no extra expense included during processing. A serious reliability hazard has thus been removed.

BRIEF INTRODUCTION OF THE DRAWINGS

In the drawings accompanying this specification:

FIGS. 1 to 3 show in illustrative cross-section steps in the application of the inventive method to the manufacture of an NMOS transistor; and, FIG. 4 is an illustrative cross-section of a PMOS transistor, produced in a similar manner.

DESCRIPTION OF PREFERRED EMBODIMENTS

So that the invention may be better understood, embodiments will now be described, and reference will be made to the drawings. The description that follows is given by way of example only.

Figure 1:
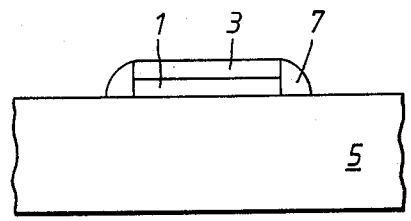

In the first step of the method, a gate oxide 1 and a polysilicon gate electrode 3 are formed on the surface of a silicon substrate 5. To this structure is added a layer of doped dielectric material—for example a sputtered oxide or spin-on glass containing phosphorus, arsenic or other suitable n-type dopant. This latter layer is then etched back by a reactive ion etch (RIE) or other anisotropic wet or dry etch technique to define small geometry sidewall structures 7.—See FIG. 1.

Figure 2:
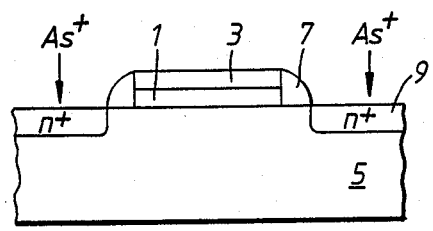

At the next step of this method, arsenic ions (As+) are implanted, a heavy dose at low energy, to produce a shallow implant 8 of enriched n-type (n+) species.—See FIG. 2.

Figure 3:
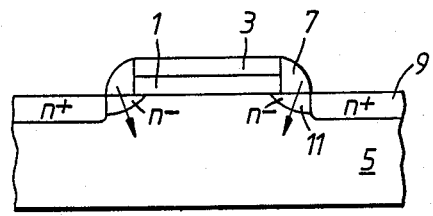

Finally, during subsequent heat treatment, the anneal stage of this process, the silicon crystal is regrown and the implanted dopant activated.—See FIG. 3.

During the anneal, n-type dopant is rejected by the dielectric medium 7 into the silicon 5. This property of n-type dopants in dielectric is used to dope the edge of the drain 9 facing the channel-n-type dopant diffuses in to provided a lightly-doped to enriched-doped $n^-/n^+$ dopant profile 11, 9. For a given bias applied during device use, the $n^-/n^+$ drain exhibits a much reduced electric field compared to n+/channel junctions alone.

Where sputtered oxide is used as the dielectric material 7, and phosphorus as the n-type dopant, the latter may be included typically in the concentration 4 to 6 wt. %. Also the enriched n-type (n+) dopant, arsenic, may be implanted at a dose on the order of $10^{15}$–$10^{16}$/cm$^2$, preferably $5 \times 10^{15}$/cm$^2$, at an energy in the range 40 to 120 keV. The anneal, which would be rapid, could be performed at a temperature of $1100° \pm 50°$ C. for a period of between 15 and 30 secs. The doping is essentially shallow, typically 0.2 μm deep.

Figure 4:
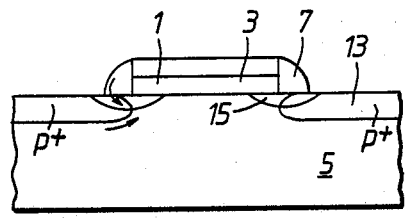

In the PMOS transistor, shown in FIG. 4, a $p^-/p^+$ drain profile 15, 13 has been defined. This is likewise produced using an n-type dopant in the dielectric sidewall structure 7. The latter dopant species (n-type) diffuses into the silicon 5 to counter dope the $p^{30}$ type species 13. The diffusion of p-type ions is faster so that no $n^-/p^+$ structure is formed.

Typically, in the above process, the enriched p-type (p+) dopant can be introduced using a boron (B) or boron-fluoride (BF$_2$) source to give a dopant concentration of $10^{15}$ to $10^{16}$/cm$^2$ at energies in the range of 5 to 25 keV. Choice of dielectric material, n-type dopant and anneal conditions can again be as above.

We claim:

1. A method for MOS transistor manufacture comprising essentially the following steps:

firstly, defining on a substrate of silicon crystal material a mesa comprised of a gate oxide and a gate electrode;

secondly, applying to the gate oxide, gate electrode, and substrate, a deposit of dielectric material incorporating a quantity of n-type dopant, and etching same to create a narrow sidewall adjacent to both the gate oxide and the gate electrode;

thirdly, introducing a heavy implant dose of p-type dopant species, to produce a shallow implant in the substrate aligned to the side of the sidewall; and, fourthly, annealing the substrate to regrow the silicon crystal, to activate the implanted dopant, and to drive incorporated dopant from the sidewall into the substrate to form a counter-doped region.

2. A method, as claimed in claim 1, wherein the incorporated n-type dopant is phosphorus and the implant dopant species is boron.

3. A method, as claimed in claim 2, wherein the implant is introduced at an energy in the range 5 to 25 keV and at a dose of $10^{15}$ to $10^{16}/cm^2$.

4. A method, as claimed in claim 3, wherein the step of anealing is performed at a temperature of $1100° \pm 50°$ C. for a period of 15 to 30 seconds.

5. A method, as claimed in claim 1, wherein the dielectric is silicon oxide.

6. A method, as claimed in claim 5, wherein the dopant is phosphorus, which dopant is incorporated in the quantity 4 to 6 percent by weight.

* * * * *